(12) United States Patent
van Druenen et al.

(10) Patent No.: US 12,031,206 B2
(45) Date of Patent: Jul. 9, 2024

(54) METHODS AND SYSTEMS FOR FORMING A LAYER COMPRISING A TRANSITIONAL METAL AND A GROUP 13 ELEMENT

(71) Applicant: ASM IP Holding, B.V., Almere (NL)

(72) Inventors: Maart van Druenen, Helsinki (FI); Qi Xie, Shanghai (CN); Charles Dezelah, Helsinki (FI); Petro Deminskyi, Helsinki (FI); Lifu Chen, Helsinki (FI); Giuseppe Alessio Verni, Vantaa (FI); Ren-Jie Chang, Leuven (BE)

(73) Assignee: ASM IP Holding, B.V., Almere (NL)

( * ) Notice: Subject to any disclaimer, the term of this patent is extended or adjusted under 35 U.S.C. 154(b) by 0 days.

(21) Appl. No.: 17/812,488

(22) Filed: Jul. 14, 2022

(65) Prior Publication Data

US 2023/0015690 A1 Jan. 19, 2023

Related U.S. Application Data

(60) Provisional application No. 63/222,121, filed on Jul. 15, 2021.

(51) Int. Cl.
| | |
|---|---|
| C23C 16/14 | (2006.01) |
| C23C 16/18 | (2006.01) |
| C23C 16/44 | (2006.01) |

(52) U.S. Cl.
CPC .......... *C23C 16/14* (2013.01); *C23C 16/18* (2013.01); *C23C 16/4408* (2013.01)

(58) Field of Classification Search
CPC ...... C23C 16/14; C23C 16/18; C23C 16/4408
See application file for complete search history.

(56) References Cited

U.S. PATENT DOCUMENTS

| | | | |
|---|---|---|---|
| 10,361,366 B2 | 7/2019 | Hakamata | |
| 2016/0376704 A1* | 12/2016 | Raisanen | .......... H01L 21/28088 |
| | | | 427/249.17 |
| 2021/0301391 A1* | 9/2021 | Givens | ................... C23C 16/56 |

* cited by examiner

*Primary Examiner* — Elizabeth A Burkhart
(74) *Attorney, Agent, or Firm* — BANNER & WITCOFF LLP

(57) ABSTRACT

Disclosed are methods and systems for depositing layers comprising a transition metal and a group 13 element. The layers are formed onto a surface of a substrate. The deposition process may be a cyclical deposition process. Exemplary structures in which the layers may be incorporated include field effect transistors, VNAND cells, metal-insulator-metal (MIM) structures, and DRAM capacitors.

10 Claims, 10 Drawing Sheets

METHODS AND SYSTEMS FOR FORMING A LAYER COMPRISING A TRANSITIONAL METAL AND A GROUP 13 ELEMENT

CROSS REFERENCE TO RELATED APPLICATIONS

This Application claims the benefit of U.S. Provisional Application 63/222,121 filed on Jul. 15, 2021, the contents of which are incorporated herein by reference in their entirety.

FIELD OF INVENTION

The present disclosure generally relates to the field of semiconductor processing methods and systems, and to the field integrated circuit manufacture. In particular, methods and systems suitable for forming layers comprising a transition metal and a group 13 element are disclosed.

BACKGROUND OF THE DISCLOSURE

The scaling of semiconductor devices, such as, for example, complementary metal-oxide-semiconductor (CMOS) devices, has led to significant improvements in speed and density of integrated circuits. However, conventional device scaling techniques face significant challenges for future technology nodes.

For example, one challenge has been finding a suitable conducting material for use as a gate electrode in aggressively scaled CMOS devices. Various gate materials might be used, such as, for example, a metal, such as a titanium nitride layer. However, in some cases, where higher work function values than those obtained with titanium nitride layers—e.g., in PMOS regions of a CMOS device—are desired, improved materials for gate electrodes are desired. In particular, such materials can include work function metals, and can be used e.g. for threshold voltage tuning.

In addition, there remains a need for new materials in other semiconductor devices such as MIM (metal-insulator-metal) structures, DRAM capacitors, and VNAND cells.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of depositing a material comprising a metal and nitrogen, to structures and devices formed using such methods, and to apparatus for performing the methods and/or for forming the structures and/or devices. The layers may be used in a variety of applications, including work function adjustment layers, and threshold voltage adjustment layers. For example, they may be used in a gate electrode in n- or p-channel metal oxide semiconductor field effect transistors (MOSFETS).

Described herein is a method for forming a material on a substrate. The method comprises providing a substrate to a reaction chamber. Then, the method comprises executing one or more super cycles. A super cycle comprises one or more transition metal sub cycles and a group 13 element sub cycle. A transition metal sub cycle comprises a transition metal precursor pulse. The transition metal precursor pulse comprises exposing the substrate to a transition metal precursor. The group 13 element sub cycle comprises a group 13 element precursor pulse that comprises exposing the substrate to a group 13 element precursor.

In some embodiments, at least one super cycle comprises a plurality of transition metal sub cycles.

In some embodiments, the transition metal sub cycle further comprises a nitrogen reactant pulse, the nitrogen reactant pulse comprising exposing the substrate to a nitrogen reactant.

In some embodiments, the group 13 element sub cycle further comprises a carbon reactant pulse that comprises exposing the substrate to a carbon reactant.

In some embodiments, a super cycle comprises a plurality of group 13 element sub cycles.

In some embodiments, the transition metal precursor comprises a transition metal halide.

In some embodiments, the transition metal halide comprises $TiCl_4$.

In some embodiments, the nitrogen reactant comprises nitrogen and hydrogen.

In some embodiments, the nitrogen reactant comprises $NH_3$.

In some embodiments, the group 13 element precursor comprises an aluminum alkyl.

In some embodiments, the aluminum alkyl comprises trimethylaluminum.

In some embodiments, the group 13 element precursor comprises aluminum.

In some embodiments, the group 13 element precursor has a general formula of $MR^1{}_2R^2$, wherein M is a group 13 element, wherein $R^1$ is a first alkyl, wherein $R^2$ is a second alkyl, and wherein $R^1$ and $R^2$ are different.

In some embodiments, $R^1$ is tert-butyl, and $R^2$ is methyl.

In some embodiments, the carbon reactant comprises carbon, hydrogen, and at least two unsaturated carbon-carbon bonds.

In some embodiments, the carbon reactant comprises a cyclohexadiene.

In some embodiments, subsequent super cycles are separated by an inter super cycle purge.

In some embodiments, subsequent transition metal sub cycles are separated by an inter transition metal sub cycle purge.

In some embodiments, the transition metal precursor pulse is separated from the nitrogen reactant pulse by an intra transition metal sub cycle purge.

In some embodiments, the group 13 element sub cycle is preceded by a pre group 13 element sub cycle purge.

In some embodiments, the group 13 element precursor pulse and the carbon reactant pulse are separated by an inter group 13 element sub cycle purge.

In some embodiments, the substrate comprises a monocrystalline silicon wafer.

Further disclosed is a field effect transistor comprising a gate contact comprising a layer formed according to a method as described herein.

Further disclosed is a MIM metal electrode comprising a layer deposited by means of a method as described herein.

Further disclosed is a VNAND contact comprising a layer deposited by means of a method as described herein.

Further disclosed is a system comprising a reaction chamber, a transition metal precursor gas source, a group 13 element precursor gas source, a nitrogen reactant gas source, and a controller. The transition metal precursor gas source comprises a transition metal precursor. The transition metal precursor comprises a transition metal. The group 13 element precursor gas source comprises a group 13 element precursor. The group 13 element precursor comprises a group 13 element. The nitrogen reactant gas source comprises a nitrogen reactant. The nitrogen reactant comprises nitrogen. The controller is configured to control gas flow into the reaction chamber to form a material on the substrate by means of a method as described herein.

These and other embodiments will become readily apparent to those skilled in the art from the following detailed description of certain embodiments having reference to the attached figures. The invention is not limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 1:
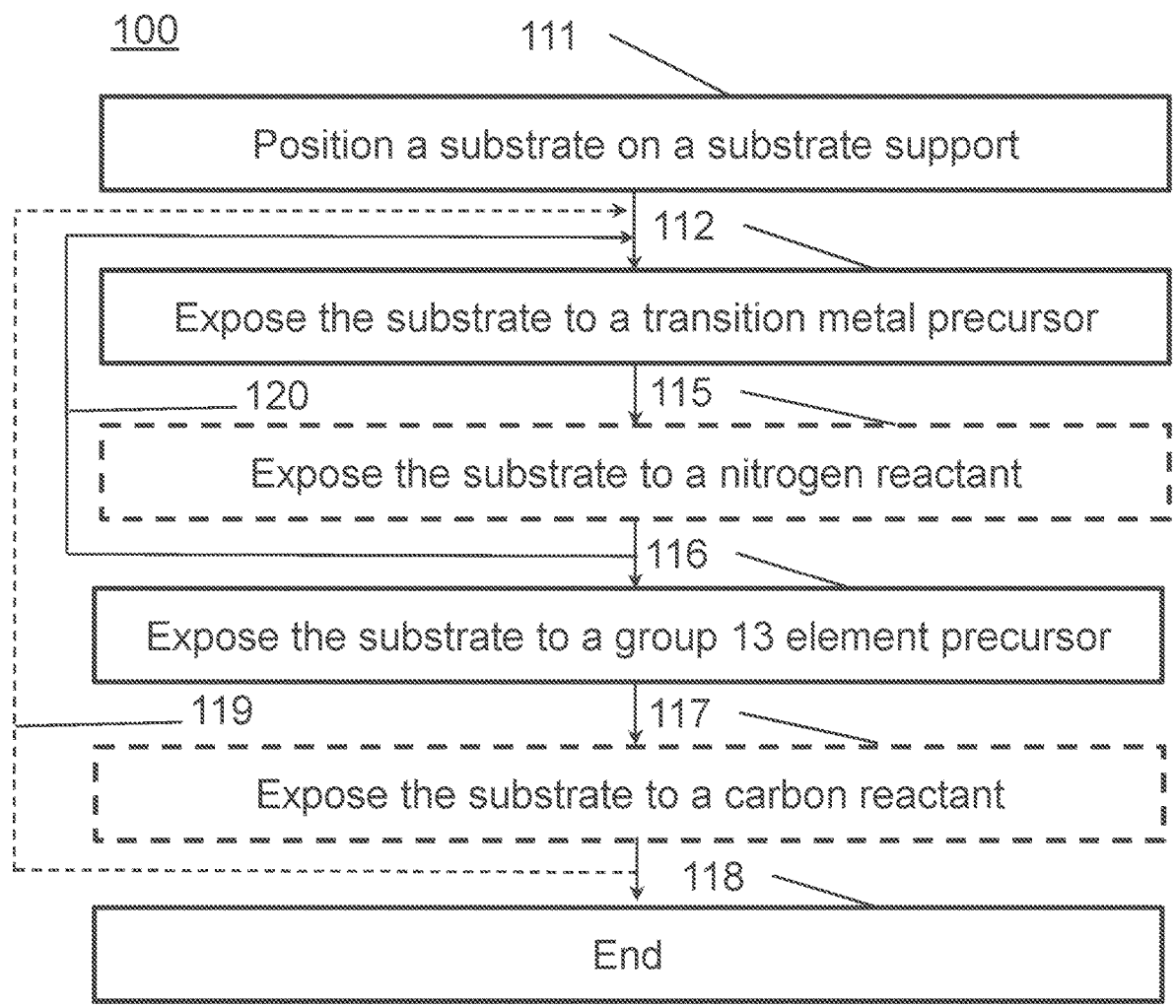
FIG. 1 illustrates an embodiment of a method as disclosed herein.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separately from each other.

As set forth in more detail below, various embodiments of the disclosure provide methods for forming structures, such as gate electrode structures. Exemplary methods can be used to, for example, to form CMOS devices, or portions of such devices. This notwithstanding, and unless noted otherwise, the invention is not necessarily limited to such examples.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas, such as a rare gas. In some cases, the term "precursor" can refer to a compound that participates in the chemical reaction that produces another compound, and particularly to a compound that constitutes a film matrix or a main skeleton of a film; the term "reactant" can be used interchangeably with the term precursor.

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of examples, a substrate can include bulk semiconductor material and an insulating or dielectric material layer overlying at least a portion of the bulk semiconductor material.

As used herein, the term "film" and/or "layer" can refer to any continuous or non-continuous structure and material, such as material deposited by the methods disclosed herein. For example, a film and/or layer can include two-dimensional materials, three-dimensional materials, nanoparticles, partial or full molecular layers or partial or full atomic layers or clusters of atoms and/or molecules. A film or layer may partially or wholly consist of a plurality of dispersed atoms on a surface of a substrate and/or embedded in a substrate/ and/or embedded in a device manufactured on that substrate. A film or layer may comprise material or a layer with pinholes and/or isolated islands. A film or layer may be at least partially continuous. A film or layer may be patterned, e.g. subdivided, and may be comprised in a plurality of semiconductor devices.

As used herein, a "structure" can be or include a substrate as described herein. Structures can include one or more layers overlying the substrate, such as one or more layers formed according to an embodiment of a method as described herein. Device portions can be or include structures.

The term "deposition process" as used herein can refer to the introduction of precursors (and/or reactants) into a reaction chamber to deposit a layer over a substrate. "Cyclical deposition processes" are examples of "deposition processes".

The term "cyclic deposition process" or "cyclical deposition process" can refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component.

The term "atomic layer deposition" can refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, metalorganic MBE, and chemical beam epitaxy, when performed with alternating pulses of precursor(s)/reactive gas(es), and purge (e.g., inert carrier) gas(es).

Generally, for ALD processes, during each cycle, a precursor is introduced to a reaction chamber and is chemisorbed on a deposition surface (e.g., a substrate surface that can include a previously deposited material from a previous ALD cycle or other material) and forming about a monolayer or sub-monolayer of material that does not readily react with additional precursor (i.e., a self-limiting reaction). Thereafter, a reactant (e.g., another precursor or reaction gas) may subsequently be introduced into the process chamber for use in converting the chemisorbed precursor to the desired material on the deposition surface. The reactant can be capable of further reaction with the precursor. Purging steps can be utilized during one or more cycles, e.g., during each step of each cycle, to remove any excess precursor from the process chamber and/or remove any excess reactant and/or reaction byproducts from the reaction chamber.

As used herein, the term "purge" may refer to a procedure in which an inert or substantially inert gas is provided to a reaction chamber in between two pulses of gasses that react with each other. For example, a purge, e.g. using a noble gas, may be provided between a precursor pulse and a reactant pulse, thus avoiding or at least minimizing gas phase interactions between the precursor and the reactant. It shall be understood that a purge can be effected either in time or in space, or both. For example in the case of temporal purges, a purge step can be used e.g. in the temporal sequence of providing a first precursor to a reaction chamber, providing a purge gas to the reaction chamber, and providing a second precursor to the reaction chamber, wherein the substrate on which a layer is deposited does not move. For example in the case of spatial purges, a purge step can take the following form: moving a substrate from a first location to which a first precursor is continually supplied, through a purge gas curtain, to a second location to which a second precursor is continually supplied.

As used herein, a "precursor" includes a gas or a material that can become gaseous and that can be represented by a chemical formula that includes an element which may be incorporated during a deposition process as described herein.

The term "nitrogen reactant" can refer to a gas or a material that can become gaseous and that can be represented by a chemical formula that includes nitrogen. In some cases, the chemical formula includes nitrogen and hydrogen. In some cases, the nitrogen reactant does not include diatomic nitrogen.

The term "oxygen reactant" can refer to a gas or a material that can become gaseous and that can be represented by a chemical formula that includes oxygen. In some cases, the chemical formula includes oxygen and hydrogen.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments.

In this disclosure, any defined meanings do not necessarily exclude ordinary and customary meanings, in some embodiments.

In one aspect, described herein is a method for forming a material on a substrate. The method comprises providing a substrate to a reaction chamber and executing a plurality of super cycles. A super cycle comprises one or more transition metal sub cycles and a group 13 element sub cycle. In some embodiments, a super cycle comprises a plurality of transition metal sub cycles. The transition metal sub cycles comprise a transition metal precursor pulse that in turn comprises exposing the substrate to a transition metal precursor. In some embodiments, the one or more transition metal sub cycles further comprise a nitrogen reactant pulse that in turn comprises exposing the substrate to a nitrogen reactant. The group 13 element sub cycle comprises a group 13 element precursor pulse that comprises exposing the substrate to a group 13 element precursor. Thus, a material comprising a transition metal and a group 13 element can be formed on the substrate.

In some embodiments, a super cycle comprises sequentially executing a transition metal sub cycle and a group 13 element sub cycle. In some embodiments, a transition metal sub cycle comprises sequentially executing a transition metal precursor pulse and a nitrogen reactant pulse. In some embodiments, a group 13 element sub cycle comprises sequentially executing a group 13 element precursor pulse and a carbon reactant pulse.

Materials formed on a substrate using a presently described method may be useful, for example, as gate stack work function tuning metals in gate electrodes of P- or N-metal oxide semiconductor field effect transistors (MOSFETs). Additionally or alternatively, they may be used in metal-insulator-metal (MIM) metal electrodes and/or in vertical NAND (VNAND) contacts.

It shall be clear to a person skilled in the art that a method as described herein can comprise a cyclical deposition process that can include cyclical chemical vapor deposition (CVD), atomic layer deposition (ALD), or a hybrid cyclical CVD/ALD process. For example, in some embodiments, the growth rate of a particular ALD process may be low compared with a CVD process. One approach to increase the growth rate may be that of operating at a higher deposition temperature than that typically employed in an ALD process, resulting in some portion of a chemical vapor deposition process, i.e. of non-self-limiting reactions, but still taking advantage of the sequential introduction of reactants. Such a process may be referred to as cyclical CVD. In some embodiments, a cyclical CVD process may comprise the introduction of two or more precursors or reactants into the reaction chamber, wherein there may be a time period of overlap between the two or more reactants in the reaction chamber resulting in both an ALD component of the deposition and a CVD component of the deposition. This is referred to as a hybrid process. In accordance with further examples, a cyclical deposition process may comprise a continuous flow of one reactant or precursor and periodic pulsing of a second reactant or precursor into the reaction chamber.

In accordance with some examples of the disclosure, forming the material comprises a thermal deposition process. In these cases, the deposition process does not include use of a plasma to form activated species for use in the deposition process.

In some embodiments, the group 13 element sub cycle further comprises a carbon reactant pulse. The carbon reactant pulse comprises exposing the substrate to a carbon reactant. Thus, a material comprising the transition metal, nitrogen, the group 13 element, and carbon can be formed on the substrate.

In some embodiments, the carbon reactant comprises carbon, hydrogen, and at least two unsaturated carbon-carbon bonds. In some embodiments, the carbon reactant comprises a cyclic alkadiene. In some embodiments, the carbon reactant comprises a cyclohexadiene. Suitable cyclohexadienes include 1,4-Cyclohexadiene and 1,3-cyclohexadiene. In some embodiments, the carbon-reactant comprises a cyclic hydrocarbon having at least two unsaturated carbon-carbon bonds.

In some embodiments, the super cycles comprise a plurality of group 13 element sub cycles.

In some embodiments, the method comprises executing a plurality of super cycles. The total number of super cycles comprised in a method as described herein depends, inter alia, on the total layer thickness that is desired. In some embodiments, the method comprises from at least 1 super cycle to at most 100 super cycles, or from at least 2 super cycles to at most 80 super cycles, or from at least 3 super cycles to at most 70 super cycles, or from at least 4 super cycles to at most 60 super cycles, or from at least 5 super cycles to at most 50 super cycles, or from at least 10 super cycles to at most 40 super cycles, or from at least 20 super cycles to at most 30 super cycles. In some embodiments, the method comprises at most 100 super cycles, or at most 90 super cycles, or at most 80 super cycles, or at most 70 super cycles, or at most 60 super cycles, or at most 50 super cycles, or at most 40 super cycles, or at most 30 super cycles, or at most 20 super cycles, or at most 10 super cycles, or at most 5 super cycles, or at most 4 super cycles, or at most 3 super cycles, or at most 2 super cycles. In some embodiments, the method comprises at least 1 super cycle, or at least 2 super cycles, or at least 5 super cycles, or at least 10 super cycles, or at least 20 super cycles, or at least 50 super cycles, or at least 100 super cycles.

In some embodiments, a layer comprising a material formed according to an embodiment of the present disclosure has a thickness from at least 0.2 nm to at most 5 nm, or from at least 0.3 nm to at most 4 nm, or from at least 0.4 nm to at most 3 nm, or from at least 0.5 nm to at most 2 nm, or from at least 0.7 nm to at most 1.5 nm or of at least 0.9 nm to at most 1.0 nm.

In some embodiments, a super cycle comprises from at least 1 to at most 1000 transition metal sub cycles, or from at least 2 to at most 5 transition metal sub cycles, or from at least 5 to at most 10 transition metal sub cycles, or from at least 10 to at most 20 transition metal sub cycles, or from at least 20 to at most 50 transition metal sub cycles, or from at least 50 to at most 100 transition metal sub cycles, or from at least 100 to at most 200 transition metal sub cycles, or from at least 200 to at most 500 transition metal sub cycles, or from at least 500 to at most 1000 transition metal sub cycles.

In some embodiments, a super cycle comprises from at least 1 to at most 1000 group 13 element sub cycles, or from at least 2 to at most 5 group 13 element sub cycles, or from at least 5 to at most 10 group 13 element sub cycles, or from at least 10 to at most 20 group 13 element sub cycles, or from at least 20 to at most 50 group 13 element sub cycles, or from at least 50 to at most 100 group 13 element sub cycles, or from at least 100 to at most 200 group 13 element sub cycles, or from at least 200 to at most 500 group 13 element sub cycles, or from at least 500 to at most 1000 group 13 element sub cycles.

In some embodiments, a super cycle comprises from at least 1 to at most 1000 transition metal sub cycles and from at least 1 to at most 1000 group 13 element sub cycles. In some embodiments, a super cycle comprises from at least 2 to at most 500 transition metal sub cycles and from at least 1 to at most 1000 group 13 element sub cycles. In some embodiments, a super cycle comprises from at least 5 to at most 200 transition metal sub cycles and from at least 1 to at most 1000 group 13 element sub cycles. In some embodiments, a super cycle comprises from at least 10 to at most 100 transition metal sub cycles and from at least 1 to at most 1000 group 13 element sub cycles. In some embodiments, a super cycle comprises from at least 20 to at most 50 transition metal sub cycles and from at least 1 to at most 1000 group 13 element sub cycles.

In some embodiments, a super cycle comprises from at least 1 to at most 1000 transition metal sub cycles and from at least 2 to at most 500 group 13 element sub cycles. In some embodiments, a super cycle comprises from at least 1 to at most 1000 transition metal sub cycles and from at least 5 to at most 200 group 13 element sub cycles. In some embodiments, a super cycle comprises from at least 1 to at most 1000 transition metal sub cycles and from at least 10 to at most 100 group 13 element sub cycles. In some embodiments, a super cycle comprises from at least 1 to at most 1000 transition metal sub cycles and from at least 20 to at most 50 group 13 element sub cycles.

In some embodiments, the group 13 element precursor comprises a group 13 metal. Suitable group 13 metals include Al, Ga, and In. In some embodiments, the group 13 element precursor comprises aluminum.

In some embodiments, the group 13 element precursor has a general formula of $MR^1{}_2R^2$, wherein $R^1$ is a first alkyl, wherein $R^2$ is a second alkyl, and wherein $R^1$ and $R^2$ are different. In some embodiments, $R^1$ is selected from propyl, butyl, pentyl, and hexyl; and M is selected from B, Al, Ga, and In. In some embodiments, $R^2$ is methyl or ethyl. In some embodiments, $R^1$ is tert-butyl, and $R^2$ is methyl.

In some embodiments, the group 13 element precursor comprises a compound that has the general formula $MR_3$, wherein M is a group 13 element selected from B, Al, Ga, and In; and wherein R is a $C_1$ to $C_4$ alkyl. In some embodiments, the group 13 element precursor comprises an aluminum alkyl. In some embodiments, the aluminum alkyl comprises trimethylaluminum.

In some embodiments, the transition metal precursor is selected from a halide, an oxohalide, and a metalorganic compound. Suitable oxohalides include oxochlorides. Suitable metalorganic compounds include beta diketonates. In some embodiments, the transition metal precursor comprises a transition metal halide. Suitable transition metal halides include transition metal fluorides, transition metal chlorides, transition metal bromides, and transition metal iodides. The transition metal in question can have any suitable oxidation state, such as +1, +2, +3, +4, +5, or +6. In some embodiments, the transition metal precursor comprises a transition metal selected from Sc, Ti, V, Cr, Mn, Fe, Co, Ni, Cu, Zn, Y, Zr, Nb, Mo, Ru, Rh, Lu, Hf, Ta, and W. In some embodiments, the transition metal halide comprises $TiCl_4$.

In some embodiments, the nitrogen reactant comprises nitrogen and hydrogen.

Exemplary nitrogen reactants can be selected from one or more of ammonia ($NH_3$), hydrazine ($N_2H_4$), alkyl-substituted hydrazines, other nitrogen and hydrogen-containing gases (e.g., a mixture of nitrogen gas and hydrogen gas), and the like. Suitable alkyl-substituted hydrazines include dimethylhydrazine and tert-butylhydrazine. The nitrogen reactant can include or consist of nitrogen and hydrogen. In some cases, the nitrogen reactant does not include diatomic nitrogen. In some embodiments, the nitrogen reactant comprises ammonia and/or hydrazine. In some embodiments, the nitrogen reactant comprises ammonia. In some embodiments, the nitrogen reactant comprises hydrazine. In some embodiments, the nitrogen reactant includes one or more gasses selected from $NH_3$, $N_2H_2$, and $R^1$—N=N—$R^2$, wherein $R^1$ and $R^2$ are independently selected from H and a hydrocarbyl. Suitable hydrocarbyl include C1 to C4 alkyls such as methyl, ethyl, propyl, and butyl. The C1 to C4 alkyls include linear and branched isomers such as isopropyl, iso-butyl, sec-butyl, and tert-butyl.

In some embodiments, the transition metal content of a layer formed by means of a method as described herein is from at least 1.0 atomic percent to at most 99.0 atomic percent, or from at least 3.0 atomic percent to at most 97.0 atomic percent, or from at least 5.0 atomic percent to at most 95.0 atomic percent, or from at least 10.0 atomic percent to at most 90.0 atomic percent, or from at least 20.0 atomic percent to at most 80.0 atomic percent, or from at least 30.0 atomic percent to at most 70.0 atomic percent, or from at least 40.0 atomic percent to at most 60.0 atomic percent.

In some embodiments, the group 13 element content of a layer formed by means of a method as described herein is from at least 1.0 atomic percent to at most 99.0 atomic percent, or from at least 3.0 atomic percent to at most 97.0 atomic percent, or from at least 5.0 atomic percent to at most 95.0 atomic percent, or from at least 10.0 atomic percent to at most 90.0 atomic percent, or from at least 20.0 atomic percent to at most 80.0 atomic percent, or from at least 30.0 atomic percent to at most 70.0 atomic percent, or from at least 40.0 atomic percent to at most 60.0 atomic percent.

In some embodiments, the nitrogen content of the layer formed by means of a method as described herein is from at least 1.0 atomic percent to at most 99.0 atomic percent, or from at least 3.0 atomic percent to at most 97.0 atomic percent, or from at least 5.0 atomic percent to at most 95.0 atomic percent, or from at least 10.0 atomic percent to at most 90.0 atomic percent, or from at least 20.0 atomic percent to at most 80.0 atomic percent, or from at least 30.0 atomic percent to at most 70.0 atomic percent, or from at least 40.0 atomic percent to at most 60.0 atomic percent.

In some embodiments, the carbon content of the layer formed by means of a method as described herein is from at least 1.0 atomic percent to at most 99.0 atomic percent, or from at least 3.0 atomic percent to at most 97.0 atomic percent, or from at least 5.0 atomic percent to at most 95.0 atomic percent, or from at least 10.0 atomic percent to at most 90.0 atomic percent, or from at least 20.0 atomic percent to at most 80.0 atomic percent, or from at least 30.0 atomic percent to at most 70.0 atomic percent, or from at least 40.0 atomic percent to at most 60.0 atomic percent.

In some embodiments, subsequent super cycles are separated by an inter super cycle purge. In some embodiments, an inter super cycle purge lasts from at least 10 ms to at most 100 ms, or from at least 100 ms to at most 1000 ms, or from at least 1000 ms to at most 10 s.

In some embodiments, subsequent transition metal sub cycles are separated by an inter transition metal sub cycle purge. In some embodiments, an inter transition metal sub cycle purge lasts from at least 10 ms to at most 100 ms, or from at least 100 ms to at most 1000 ms, or from at least 1000 ms to at most 10 s.

In some embodiments, the transition metal precursor pulse is separated from the nitrogen reactant pulse by an intra transition metal sub cycle purge. In some embodiments, an intra transition metal sub cycle purge lasts from at least 10 ms to at most 100 ms, or from at least 100 ms to at most 1000 ms, or from at least 1000 ms to at most 10 s.

In some embodiments, the group 13 element sub cycle is preceded by a pre group 13 element sub cycle purge. In some embodiments, a pre group 13 element sub cycle purge lasts from at least 10 ms to at most 100 ms, or from at least 100 ms to at most 1000 ms, or from at least 1000 ms to at most 10 s.

In some embodiments, the group 13 element precursor pulse and the carbon reactant pulse are separated by an inter group 13 element sub cycle purge. In some embodiments, an inter group 13 element sub cycle purge lasts from at least 10 ms to at most 100 ms, or from at least 100 ms to at most 1000 ms, or from at least 1000 ms to at most 10 s.

It shall be understood that, in some embodiments, providing a purge between subsequent parts of a method as described herein can allow minimizing parasitic reactions between different precursors and reactants.

In some embodiments, the transition metal precursor pulse and the nitrogen reactant pulse at least partially overlap.

In some embodiments, the transition the nitrogen reactant pulse and the group 13 element precursor pulse at least partially overlap.

In some embodiments, the group 13 element precursor pulse and the carbon reactant pulse at least partially overlap.

A monocrystalline silicon wafer may be a suitable substrate. Other substrates may be suitable well, e.g. monocrystalline germanium wafers, gallium arsenide wafers, quartz, sapphire, glass, steel, aluminum, silicon-on-insulator substrates, plastics, etc.

In some embodiments, a layer comprising a material formed according to an embodiment of the present disclosure has a step coverage equal to or greater than about 50%, or greater than about 80%, or greater than about 90%, or about 95%, or about 98%, or about 99% or greater, in/on gaps having aspect ratios (height/width) of more than about 2, more than about 5, more than about 10, more than about 25, more than about 50, more than about 100, or between about 10 and 100 or about 5 to about 25. It shall be understood that the term "step coverage" refers to the thickness of the layer inside a gap vis-à-vis the thickness of that layer outside the gap.

In some embodiments, the material is formed at a substrate temperature of less than 500° C., or of at least 50° C. to at most 500° C., or of at least 75° C. to at most 400° C., or of at least 100° C. to at most 300° C., or of at least 100° C. to at most 200° C., or of at least 100° C. to at most 150° C.

In some embodiments, the presently described methods are carried out at a pressure of less than 1000 Pa, or of at least 0.1 Pa to at most 1.0 Pa, or of at least 1.0 Pa to at most 10 Pa, or of at least 10 Pa to at most 100 Pa, or of at least 100 Pa to at most 1000 Pa, or of at least 1000 Pa to at most 10000 Pa.

In some embodiments, one or more precursors and/or reactants are entrained by a carrier gas. In some embodiments, the carrier gas is provided at a flow rate of at least 0.2 to at most 2.0 slpm, or from at least 0.3 to at most 1.5 slpm, or from at least 0.4 to at most 1.0 slpm, or from at least 0.5 to at most 0.7 slpm. In some embodiments, $N_2$ is used as a carrier gas. In some embodiments, a noble gas is used as a carrier gas. Suitable noble gasses include He, Ne, Ar, Kr, and Xe.

In some embodiments, a method as described herein is carried out until a material containing layer having a thickness of least 0.2 nm to at most 5 nm is formed on the substrate.

In some embodiments, a method as described herein is employed for forming a material on a substrate that comprises one or more bilayers. A bilayer comprises a transition metal sub layer and a group 13 element sub layer. In some embodiments, the material comprises from at least 1 bilayer to at most 100 bilayers, or from at least 1 bilayer to at most 2 bilayers, or from at least 2 bilayers to at most 5 bilayers, or from at least 5 bilayers to at most 10 bilayers, or from at least 10 bilayers to at most 20 bilayers, or from at least 20 bilayers to at most 50 bilayers, or from at least 50 bilayers to at most 100 bilayers. In some embodiments, the transition metal sub layer has a thickness of at least 0.1 nm to at most 10 nm, or from at least 0.1 nm to at most 0.2 nm, or from at least 0.2 nm to at most 0.5 nm, or from at least 0.5 nm to at most 1.0 nm, or from at least 1.0 nm to at most 2.0 nm, or from at least 2.0 nm to at most 5.0 nm, or from at least 5.0 nm to at most 10.0 nm. In some embodiments, the group 13 element sub layer has a thickness of at least 0.1 nm to at most 10 nm, or from at least 0.1 nm to at most 0.2 nm, or from at least 0.2 nm to at most 0.5 nm, or from at least 0.5 nm to at most 1.0 nm, or from at least 1.0 nm to at most 2.0 nm, or from at least 2.0 nm to at most 5.0 nm, or from at least 5.0 nm to at most 10.0 nm.

In accordance with yet additional embodiments of the disclosure, a device or portion thereof can be formed using a method and/or a structure as described herein. The device can include a substrate, an insulating or dielectric layer, a material layer containing a material formed according to an embodiment of a method as described herein, and overlying the insulating or dielectric layer, and optionally an additional metal layer overlying the material layer containing the material formed according to an embodiment of a method as described herein. The device can be or form part of, for example, a MOSFET, e.g. a pMOSFET or an nMOSFET. Thus, further described herein is a field effect transistor. It comprises a gate contact that in turn comprises a layer that is formed according to an embodiment of a method as described herein. Suitable field effect transistor include FINFETS, forksheet devices, and gate-all-around MOSFETS.

A layer as described herein can be suitably used in a contact of a capacitor, e.g. a metal-insulator-metal capacitor (MIM), as are encountered, for example, in DRAM memory. Thus, further described herein is a MIM metal electrode comprising a layer deposited by means of a method as described herein.

A layer as described herein can be suitably used in a contact of a floating gate memory cell, as can be employed, for example, in VNAND memory. Thus, further described herein is a VNAND contact comprising a layer deposited by means of a method as described herein.

Further described herein is a wire partially or wholly lined with a layer comprising a material formed by means of a method according to the present disclosure. In some embodiments, the wire comprises copper. In some embodiments, the wire comprises cobalt. In some embodiments, the wire comprises copper and cobalt. In some embodiments, the wire comprises tungsten. In some embodiments, the wire comprises molybdenum. In some embodiments, the wire comprises a core that consists of, or that substantially consists of, molybdenum, copper, and/or tungsten. Advantageously, the layer is formed according to a method for forming a layer on a on a substrate in a reaction chamber as described herein. It shall be understood that the term "wire" may refer to an interconnect or to a plurality of interconnects, which are commonly encountered in integrated circuits.

Further described herein is a system that comprises a reaction chamber, a transition metal precursor gas source, a group 13 element precursor gas source, an optional nitrogen reactant gas source, optionally a carbon reactant gas source, and a controller. The transition metal precursor gas source comprises a transition metal precursor. The transition metal precursor comprises, in turn, a transition metal. The group 13 element precursor gas source comprises a group 13 element precursor. The group 13 element precursor in turn comprises a group 13 element. The nitrogen reactant gas source comprises a nitrogen reactant. The nitrogen reactant comprises, in turn, nitrogen. In some embodiments, the system further comprises a carbon reactant gas source comprising a carbon reactant. It shall be understood that the carbon reactant comprises carbon. The controller is configured to control gas flow into the reaction chamber to form a material on the substrate by means of a method as described herein.

FIG. 1 shows a schematic representation of an embodiment of a method as described herein. This method (100) can be used to, for example, form a gate electrode structure suitable for NMOS, PMOS, and/or CMOS devices, such as for uses as a work function metal for a source, or drain electrode of a metal oxide semiconductor field effect transistor. However, unless otherwise noted, methods are not limited to such applications. The method comprises a step (111) of positioning a substrate on a substrate support. The substrate support is positioned in a reaction chamber. Suitable substrate supports include pedestals, susceptors, and the like. The substrate is then exposed to a transition metal precursor (112) and to a group 13 element precursor (116). Optionally, the substrate is exposed to a nitrogen reactant (115) and to a carbon reactant (117).

The steps of exposing the substrate to a transition metal precursor (112) and optionally exposing the substrate to a nitrogen reactant (115) are repeated (120) one or more times to form a plurality of transition metal sub cycles.

In some embodiments, the steps of exposing the substrate to a transition metal precursor (112), to a nitrogen reactant (115), to a group 13 element precursor (116), and to a carbon reactant (117) are executed consecutively. In other words, and in some embodiments, these steps do not overlap. In some embodiments, one or more of the steps of exposing the substrate to a transition metal precursor (112), to a nitrogen reactant (115), to a group 13 element precursor (116), and to a carbon reactant (117) at least partially overlap. In some embodiments, one or more of the steps of exposing the substrate to a transition metal precursor (112), to a nitrogen reactant (115), to a group 13 element precursor (116), and to a carbon reactant (117) are executed consecutively, whereas the remaining steps are executed in a sequential manner.

Optionally, the substrate is exposed to a purge gas after one or more of the steps of exposing the substrate to a transition metal precursor (112), exposing the substrate to a nitrogen reactant (115), exposing the substrate to a group 13 element precursor (116), and exposing the substrate to a carbon reactant (117). Such purging can be done, for example, by means of a noble gas. Exemplary noble gasses include He, Ne, Ar, Xe, and Kr. A purge can comprise providing a purge gas to a reaction chamber. Alternatively, purging can comprise transporting the substrate through a purge gas curtain. During a purge, surplus chemicals and reaction byproducts, if any, can be removed from the substrate surface before the substrate is contacted with the next reactive chemical.

In some embodiments, exposing the substrate to a transition metal precursor (112), optionally exposing the substrate to a nitrogen reactant (115), exposing the substrate to a group 13 element precursor (116), and optionally exposing the substrate to a carbon reactant (117) are repeated (119) one or more times.

This method is continued until a layer comprising a material having a pre-determined thickness is formed on the substrate, at which point the method ends (118).

Figure 2:
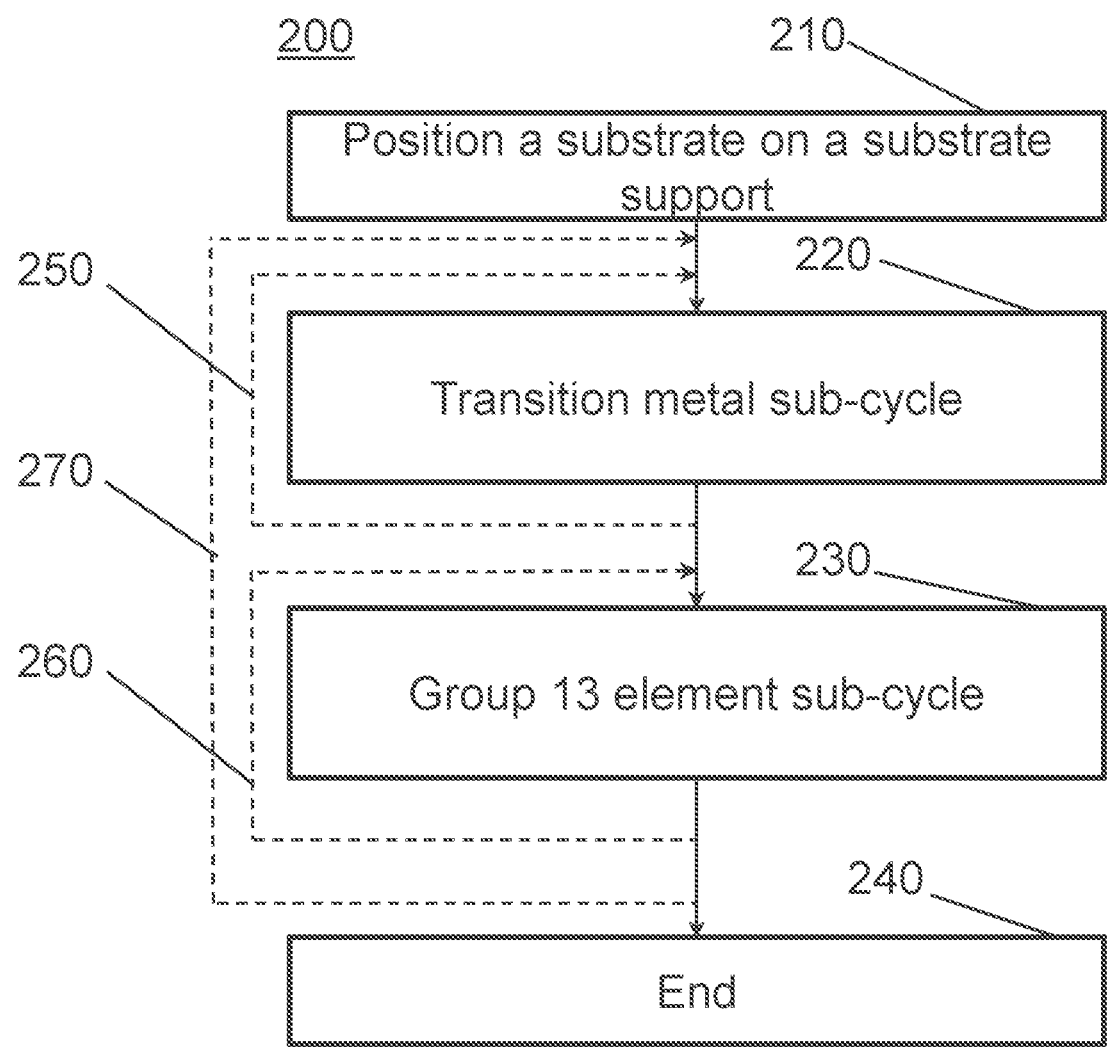
FIG. 2 illustrates an embodiment of a method as disclosed herein.

FIG. 2 shows another schematic representation of an embodiment of a method (200) as described herein. The method (200) comprises a step (210) of positioning a substrate on a substrate support. Then, the method (200) comprises a transition metal sub-cycle (220). Optionally, the transition metal sub-cycle (220) is repeated (250) one or more times. Then, the method (200) comprises a group 13 element sub cycle (230). Optionally, the group 13 element sub cycle (230) is repeated one or more times. Furthermore, the method can optionally comprise executing a plurality of super cycles (270). A super cycle (270) comprises one or more transition metal sub-cycles (220), and or more group 13 element sub cycles (230). A transition metal sub-cycle (220) comprises a transition metal precursor pulse and optionally a nitrogen reactant pulse. A group 13 element sub-cycle (230) comprises a group 13 element precursor pulse and optionally a carbon reactant pulse. The total number of super cycles (270) that is executed is selected to arrive at a pre-determined amount of material that is deposited on the substrate. When such a pre-determined amount of material has been deposited on the substrate, the method (200) ends (240).

A method according to FIG. 1 or 2 can include heating the substrate to a desired deposition temperature within the reaction chamber. In some embodiments, a method according to FIG. 1 or 2 includes heating the substrate to a temperature of less than 500° C. For example, in some embodiments of the disclosure, heating the substrate to a deposition temperature may comprise heating the substrate to a temperature between approximately 100° C. and approximately 500° C., about 200° C. and about 400° C., or about 250° C. and about 350° C.

In addition to controlling the temperature of the substrate, a pressure within the reaction chamber may also be regulated. For example, in some embodiments of the disclosure, the pressure within the reaction chamber during a method according to FIG. 1 or 2 may be less than 760 Torr or between 0.2 Torr and 760 Torr, about 0.5 Torr and 100 Torr, or about 1 Torr and 10 Torr, or less than 5 Torr.

Figure 3:
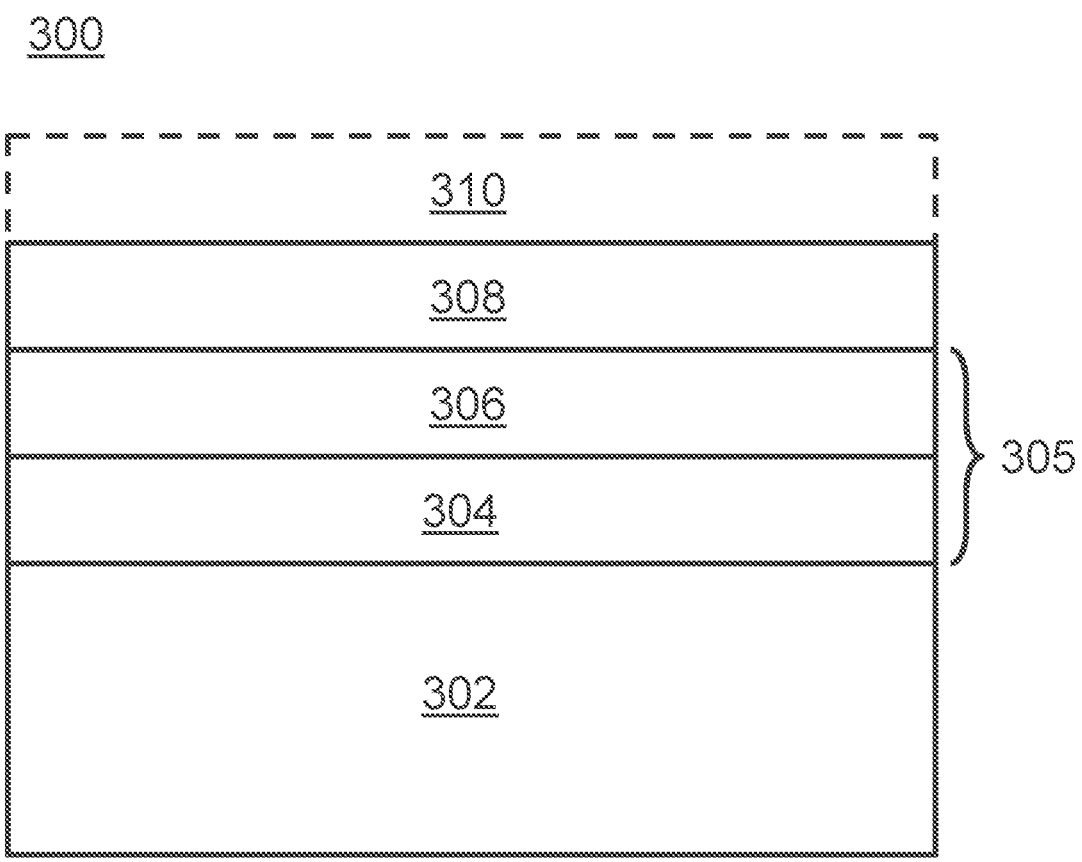
FIG. 3 illustrates a structure/a portion of a device 300 in accordance with additional examples of the disclosure.

FIG. 3 illustrates a structure/a portion of a device (300) in accordance with additional examples of the disclosure. This device or structure (300) includes a substrate (302), a dielectric or insulating material (305), and a layer (308) which is formed according to an embodiment of a method as described herein. In the illustrated example, the structure (300) also includes an additional, and optional, conducting layer (310).

The substrate (302) can be or can include any of the substrate materials described herein.

The dielectric or insulating material (305) can include one or more dielectric or insulating material layers. By way of example, the dielectric or insulating material (305) can include an interface layer (304) and a high-k material (306) deposited overlying the interface layer (304). In some cases, the interface layer (304) may not exist or may not exist to an appreciable extent. The interface layer (304) can include an oxide, such as a silicon oxide, which can be formed on a surface of the substrate (302) using, for example, a chemical oxidation process or an oxide deposition process. A high-k material (306) can be or can include, for example, a metal oxide having a dielectric constant greater than about 7. In some embodiments, the high-k material has a dielectric constant higher than the dielectric constant of silicon oxide. Exemplary high-k materials include one or more of hafnium oxide ($HfO_2$), tantalum oxide ($Ta_2O_5$), zirconium oxide ($ZrO_2$), titanium oxide ($TiO_2$), hafnium silicate ($HfSiO_x$), aluminum oxide ($Al_2O_3$) or lanthanum oxide ($La_2O_3$), or mixtures/laminates thereof. A layer (308) which is formed according to an embodiment of a method as described herein, can comprise one or more elements the composition of which exhibits a concentration gradient. In other words, a concentration of its constituents can vary from a bottom of the layer (308) to a top of the layer (308) by, for example, controlling an amount of precursor and/or reactant and/or respective pulse times during one or more deposition cycles. In some cases, the layer (308) formed by a method as described herein can have a stoichiometric composition. Its work function, as well as other properties, can be altered by altering its composition.

The layer (308) formed by means of a method as described herein comprises a transition metal, a group 13 element, optionally nitrogen, and optionally carbon. It can include impurities, such as halides, hydrogen or the like. In some embodiments, the impurity content may be less than one atomic percent, less than 0.2 atomic percent, or less than 0.1 atomic percent, or less than 0.05 atomic percent, alone or combined.

The additional conducting layer (312) can include, for example, metal, such as a refractory metal or the like.

In some embodiments (not shown) a layer (308) formed by a method as described herein can be positioned between two conductive, e.g. metal or metal nitride, layers that have a different composition than the layer (308) formed by a method as described herein.

In some embodiments (not shown), a further conductive, e.g. metal or metal nitride, layer can be positioned between a high-k dielectric layer and a layer (308) formed by a method as described herein. The further conductive layer can suitably have a thickness of 2.0 nm or less, e.g. a thickness of 0.5 nm, 1.0 nm, or 1.5 nm. Accordingly, an electrode is formed in which a layer (308) formed by a method as described herein can suitably alter the work function of the electrode, without changing the chemical nature of the interface between the electrode and the high-k dielectric.

A thickness of the layer (308) formed by means of a method as described herein can vary according to application. By way of examples, a thickness of this layer 308 can be less than 5 nm or about 0.2 nm to about 5 nm, or about 0.3 nm to about 3 nm, or about 0.3 nm to about 1 nm. When used, e.g., for controlling the threshold voltage in pMOS-FETS, the layer (308) formed according to an embodiment of a method as described herein may be relatively thin, which may be desirable for many applications, including work function and/or voltage threshold adjustment layers. Exemplary thicknesses are from 0.1 to 5.0 nm, 0.2 to 4.0 nm, 0.3 to 3.0 nm, 0.4 to 2.0 nm, 0.5 to 1.5 nm, 0.7 nm to 1.3 nm, or 0.9 nm to 1.1 nm. In some embodiments, the layer may have a thickness of less than 0.1 nm. It shall be understood that such layers are not necessarily continuous, and may even consist of a plurality of isolated clusters of atoms and/or a plurality of isolated atoms.

In some embodiments, a layer (308) formed according to an embodiment of a method as described herein can have a higher thickness, e.g. a thickness of at least 5 nm to at most 100 nm, or of at least 10 nm to at most 60 nm, or of at least 20 nm to at most 40 nm.

Additionally or alternatively, the layer (308) formed according to an embodiment of a method as described herein can form a continuous film—e.g., using method according to FIG. 1 or according to FIG. 2—at a thickness of less than <5 nm, <4 nm, <3 nm, <2 nm, <1.5 nm, <1.2 nm, <1.0 nm, or <0.9 nm. The layer (308) formed according to an embodiment of a method as described herein can be relatively smooth, with relatively low grain boundary formation. In some cases, the layer (308) formed according to an embodiment of a method as described herein may be amorphous, or may comprise amorphous regions. Additionally or alternatively, this layer (308) may comprise relatively low columnar crystal structures (as compared to TiN). The RMS roughness of an exemplary layer (308) formed according to an embodiment of a method as described herein can be <1.0 nm, <0.7 nm, <0.5 nm, <0.4 nm, <0.35 nm, or <0.3 nm, at a thickness of less than 10 nm.

A work function of a layer (308) formed according to an embodiment of a method as described herein can be from at least 4.2 eV to at most 4.8 eV, for example from at least 4.2 eV to at most 4.4 eV, or from at least 4.4 eV to at most 4.6 eV, or from at least 4.6 eV to at most 4.8 eV. A work function value of a gate contact can be shifted by about 30 meV to about 400 meV, or about 30 meV to about 200 meV, or about 50 meV to about 100 meV using such a layer, compared to a gate contact not comprising such a layer (308).

Figure 4:
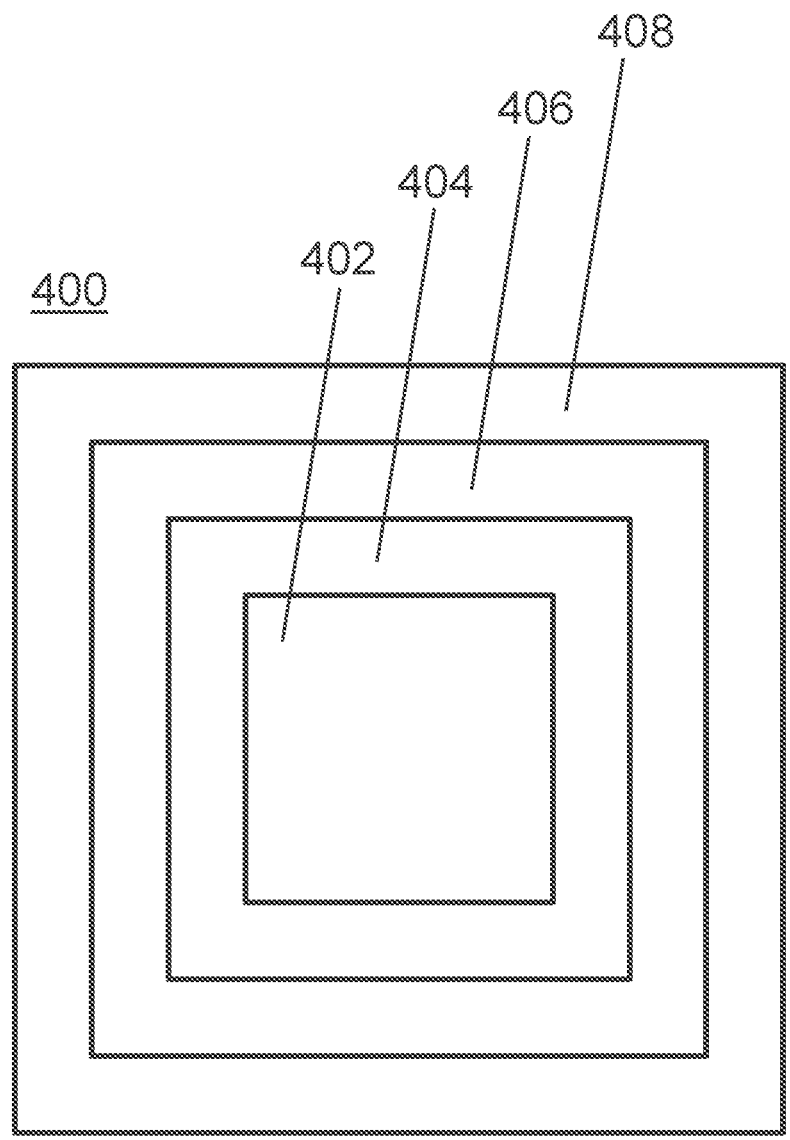
FIG. 4 illustrates another structure 400 in accordance with examples of the disclosure.

FIG. 4 illustrates another structure (400) in accordance with examples of the disclosure. The structure (400) is suitable for gate all around field effect transistors (GAA FET) (also referred to as lateral nanowire FET) devices and the like.

In the illustrated example, the structure (400) includes a semiconductor material (402), a dielectric material (404), a layer (406) formed according to an embodiment of a method as described herein, and a conducting layer (408). In some embodiments (not shown), the structure further comprises an additional conducting layer between the dielectric material and the layer formed according to an embodiment of a method as described herein. The structure (400) can be formed overlying a substrate, including any substrate materials described herein. In some embodiments, the layer (406) formed according to an embodiment of a method as described herein can be positioned between the conducting layer (408) and the dielectric material (406), as shown. Alternatively, the layer (406) formed according to an embodiment of a method as described herein can be positioned inside the conducting layer 408 (embodiment not shown).

The semiconductor material (402) can include any suitable semiconducting material. For example, the semiconductor material (402) can include Group IV, Group III-V, or Group II-VI semiconductor material. By way of example, the semiconductor material (402) can include silicon.

The dielectric material (404) can be the same or similar to the high-k material (306) as described in the context of FIG. 3. The layer (406) formed according to an embodiment of a method as described herein of FIG. 4 can be similar to the layer (308) formed according to an embodiment of a method as described herein, as described in the context of FIG. 3.

Figure 5:
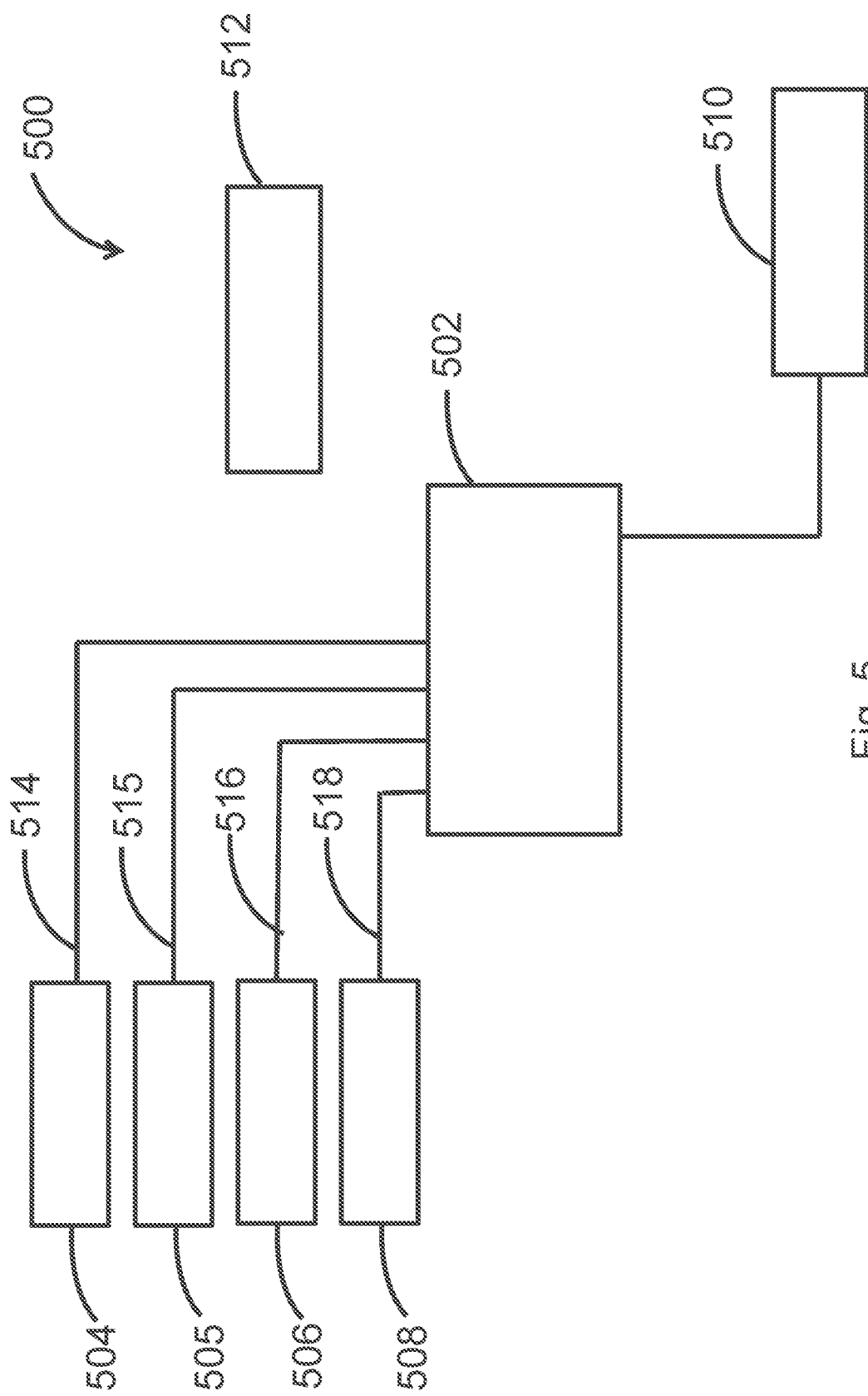
FIG. 5 illustrates a system 500 in accordance with yet additional exemplary embodiments of the disclosure.

FIG. 5 illustrates a system (500) in accordance with yet additional exemplary embodiments of the disclosure. The system (500) can be used to perform a method as described herein and/or form a structure or device portion as described herein.

In the illustrated example, the system (500) includes one or more reaction chambers (502), a transition metal precursor gas source (504), an optional nitrogen reactant gas source (505), a group 13 element precursor gas source (506), and an optional carbon reactant gas source (508). Of course, the system (500) can optionally comprise further gas sources, such as purge gas sources (not shown). In some embodiments, the carbon reactant gas source (508) can be omitted. The system further comprises an exhaust (510) and a controller (512).

The reaction chamber (502) can include any suitable reaction chamber, such as an ALD or CVD reaction chamber.

Any one of the precursor gas sources (504,506) can include a vessel and one or more precursors as described herein. A precursor gas source (504,506) can optionally comprise a mixing unit for mixing precursor with one or more carrier (e.g., noble) gases. The reactant gas sources (505,508) can include a vessel and one or more reactants as described herein. A reactant gas source (505,508) can optionally comprise a mixing unit for mixing reactant with one or more carrier gases.

A purge gas source (not shown) can include one or more inert gases as described herein. Although illustrated with four gas sources (504-508), the system (500) can include any suitable number of gas sources. The gas sources (504-508) can be coupled to one or more reaction chambers (502) via lines (514-518), which can include flow controllers, valves, heaters, and the like.

The exhaust (510) can include one or more vacuum pumps.

The controller (512) includes electronic circuitry and software to selectively operate valves, manifolds, heaters, pumps and other components included in the system (500). Such circuitry and components operate to introduce precursors, reactants, and purge gases from the respective sources (504-508). The controller (512) can control timing of gas pulse sequences, temperature of the substrate and/or reaction chamber, pressure within the reaction chamber, and various other operations to provide proper operation of the system (500).

The controller (512) can include control software to electrically or pneumatically control valves to control flow of precursors, reactants and purge gases into and out of the reaction chamber (502). The controller (512) can include modules such as a software or hardware component, e.g., a FPGA or ASIC, which performs certain tasks. A module can advantageously be configured to reside on the addressable storage medium of the control system and be configured to execute one or more processes.

Other configurations of the system (500) are possible, including different numbers and kinds of precursor and reactant sources, and the inclusion of one or more purge gas sources. Further, it will be appreciated that there are many arrangements of valves, conduits, precursor sources, and purge gas sources that may be used to accomplish the goal of selectively feeding gases into the reaction chamber (502). Further, as a schematic representation of a system, many components have been omitted for simplicity of illustration, and such components may include, for example, various valves, manifolds, purifiers, heaters, containers, vents, and/ or bypasses.

During operation of the reactor system (500), substrates, such as semiconductor wafers (not illustrated), are transferred from, e.g., a substrate handling system to reaction chamber (502). Once substrate(s) are transferred to reaction chamber (502), one or more gases from the gas sources (504-508), such as precursors, reactants, carrier gases, and/ or purge gases, are introduced into the reaction chamber (502).

Figure 6:
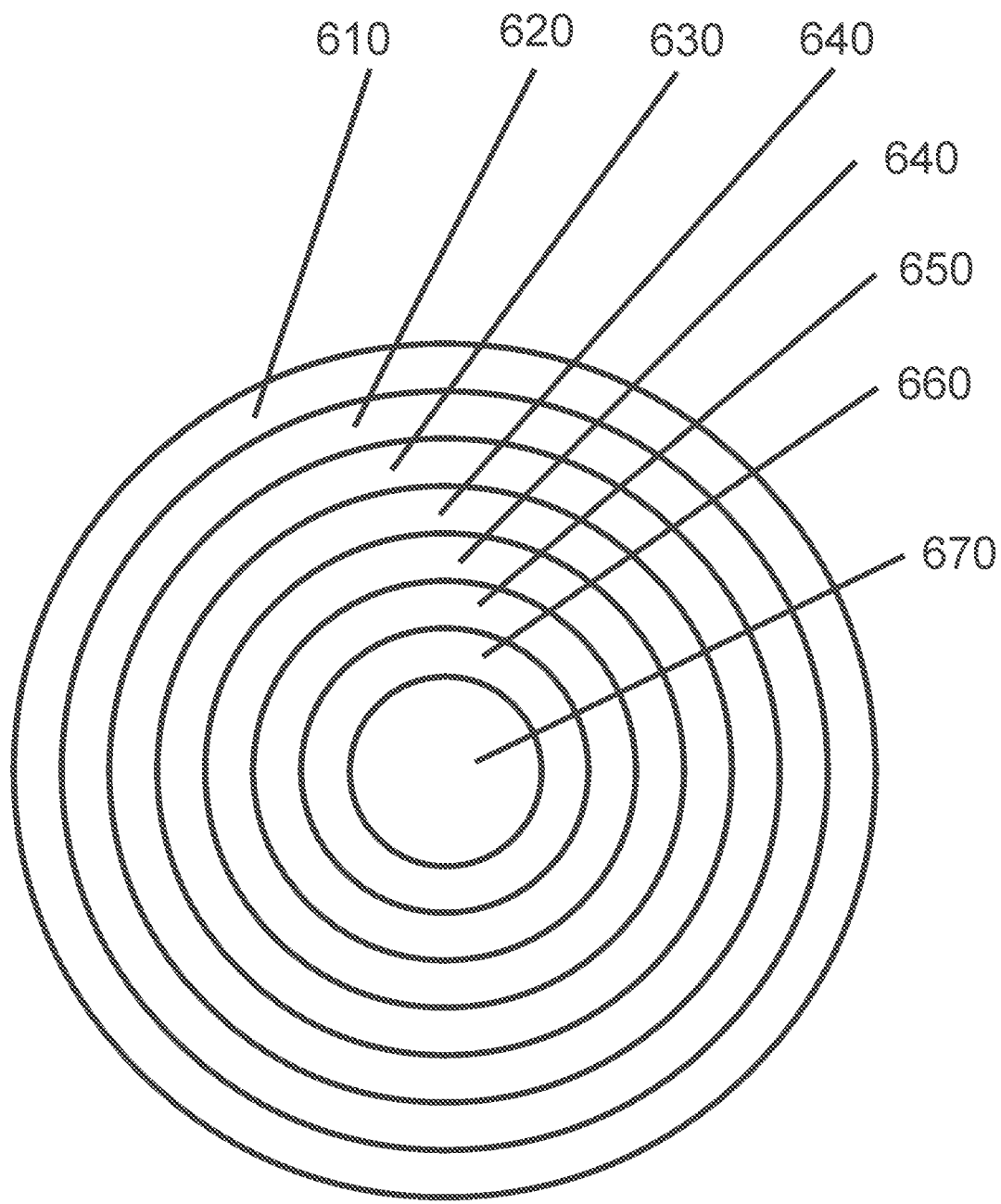
FIG. 6 illustrates an exemplary DRAM capacitor (600).

FIG. 6 illustrates an exemplary DRAM capacitor (600). It includes a top electrode (610,670) which comprises two parts, i.e. an inner shell and an outer shell, in the embodiment shown. This notwithstanding, the top electrode may comprise just one part, or may comprise more than two parts, e.g. three or more parts. It shall be understood that the two parts of the top electrode (610,670) in the embodiment of FIG. 6 are electrically connected to each other (connection not shown), i.e. it shall be understood that during normal operation, they are kept at the same, or approximately the same, electrical potential.

The top electrode (610,670) comprises a material formed according to a method as described herein. The top electrode (610,670) may, for example, have a thickness of at least 0.5 nm to 5.0 nm, or of at least 1.0 nm to at most 4.0 nm, or of at least 2.0 nm to at most 3.0 nm, or of at least 0.5 nm to at most 2.5 nm, or of at least 0.6 nm to at most 2.0 nm, or of at least 0.7 nm to at most 1.5 nm. The DRAM capacitor (600) further comprises a bottom electrode (640). The bottom electrode (640) comprises a layer formed according to a method as described herein.

In some embodiments, the composition of the bottom electrode (640) equals the composition of the top electrode (610,670). Alternatively, the composition of the bottom electrode (640) may differ from the composition of the top electrode (610,670). The bottom electrode (640) may, for example, have a thickness of at least 1.0 nm to at most 10.0 nm or of at least 3.0 nm to at most 7.0 nm, or of at least 0.5 nm to 5.0 nm, or of at least 1.0 nm to at most 4.0 nm, or of at least 2.0 nm to at most 3.0 nm, or of at least 0.5 nm to at most 2.5 nm, or of at least 0.6 nm to at most 2.0 nm, or of at least 0.7 nm to at most 1.5 nm. The bottom electrode (640) is separated from an outer shell of the top electrode (610) by one or more dielectric layers (620,630). The embodiment shown features two dielectric layers (620,630). The one or more dielectric layers (620,630) may comprise a high-k dielectric. For example, the high-k dielectric may be selected from the list comprising hafnium oxide ($HfO_2$), tantalum oxide ($Ta_2O_5$), zirconium oxide ($ZrO_2$), titanium oxide ($TiO_2$), hafnium silicate ($HfSiO_x$), aluminum oxide ($Al_2O_3$) or lanthanum oxide ($La_2O_3$), and mixtures/laminates thereof. In some embodiments, the two dielectric layers (620,630) have the same composition. In some embodiments, dielectric layer (620) has a different composition than dielectric layer (630). The combined thickness of the two dielectric layers (620,630) may be, for example, from at least 0.5 nm to at most 10.0 nm or of at least 1.0 nm to at most 8.0 nm, or of at least 2.0 nm to at most 6.0 nm, or of at least 3.0 nm to at most 4.0 nm.

An inner shell of the top electrode (670) is separated from the bottom electrode (640) by means of one or more dielectric layers (650,660). The embodiment shown features two such dielectric layers. The one or more dielectric layers (650,660) may comprise a high-k dielectric. For example, the high-k dielectric may be selected from the list comprising hafnium oxide ($HfO_2$), tantalum oxide ($Ta_2O_5$), zirconium oxide ($ZrO_2$), titanium oxide ($TiO_2$), hafnium silicate ($HfSiO_x$), aluminum oxide ($Al_2O_3$) or lanthanum oxide ($La_2O_3$), and mixtures/laminates thereof. In some embodiments, dielectric layer (650) has the same composition as dielectric layer (660). In some embodiments, dielectric layer (650) has a different composition than dielectric layer (660). The combined thickness of the dielectric layers (650,660) may be, for example, from at least 0.5 nm to at most 10.0 nm or of at least 1.0 nm to at most 8.0 nm, or of at least 2.0 nm to at most 6.0 nm, or of at least 3.0 nm to at most 4.0 nm. In some embodiments, the thickness of the one or more dielectric layers (620,630) between the outer shell of the top electrode (610) and the bottom electrode (640) equals the thickness of the one or more dielectric layers (650,660) between the inner shell of the top electrode (670) and the bottom electrode (640), e.g. within a margin of error of less than 2.0 nm, or less than 1.5 nm, or less than 1.0 nm, or less than 0.5 nm, or less than 0.4 nm, or less than 0.3 nm, or less than 0.2 nm, or less than 0.1 nm. A gap filling dielectric (680) may be centrally disposed in the DRAM capacitor (680). Exemplary gap filling dielectrics include low-k dielectrics, e.g. SiOC, SiOCN, and the like.

Figure 7:
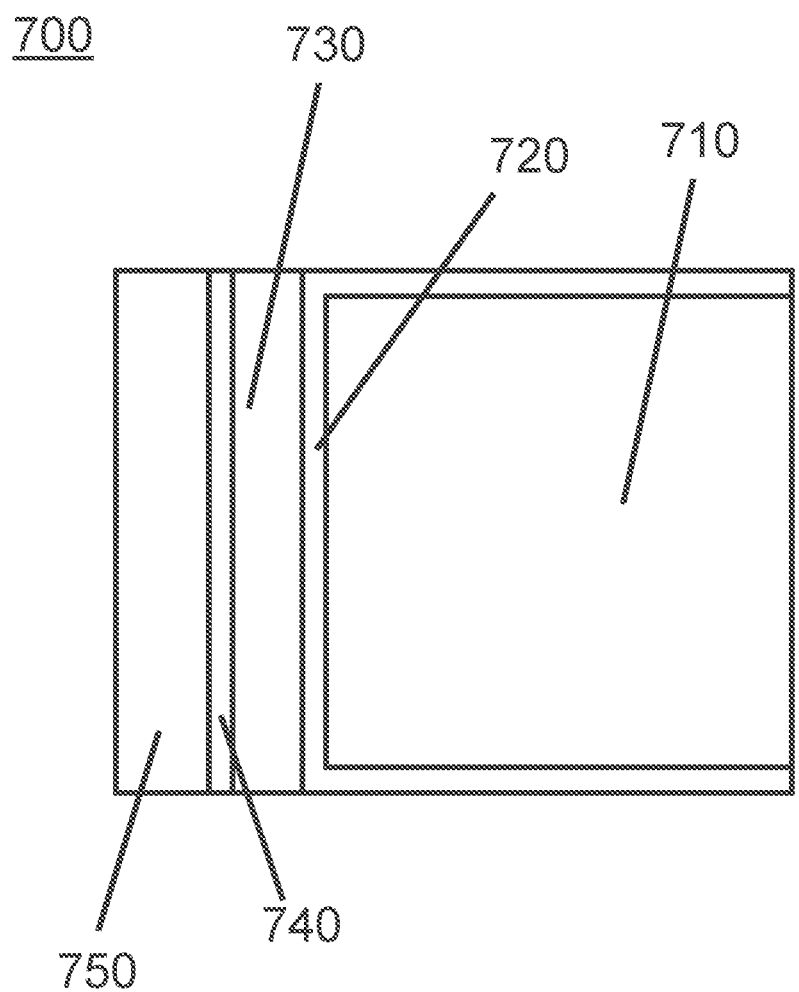
FIG. 7 illustrates a part of a VNAND cell, namely a contact and charge trapping assembly (700).

FIG. 7 illustrates a part of a floating gate transistor that can be used, for example, in a VNAND memory cell. FIG. 7 particularly shows a contact and charge trapping assembly (700). The contact and charge trapping assembly (700) comprises a metal layer (710). The metal layer (710) may be made from a metal such as copper, tungsten, etc. Additionally or alternatively, the metal layer (710) may comprise a material that is formed by means of a method as described herein. As illustrated in FIG. 7, the metal layer (710) may be lined with a liner (720). The liner may improve adhesion and/or may prevent or at least minimize out diffusion of metal, e.g. copper or tungsten, from the metal layer (710). Advantageously, the liner (720) comprises a layer comprising a material formed by means of a method as described herein. The contact and charge trapping assembly (700) comprises a charge trapping layer (740). The charge trapping layer (740) is positioned between two dielectric layers (730,750). The charge trapping layer may comprise a conductive layer such as, for example, silicon nitride. Additionally or alternatively, the charge trapping layer may comprise a layer that is formed by means of a method as described herein.

One of the dielectric layers (730) is adjacent to the liner (720). This dielectric layer (730) may, for example, comprise a high-k material. For example, the high-k material may be selected from the list comprising hafnium oxide ($HfO_2$), tantalum oxide ($Ta_2O_5$), zirconium oxide ($ZrO_2$), titanium oxide ($TiO_2$), hafnium silicate ($HfSiO_x$), aluminum oxide ($Al_2O_3$) or lanthanum oxide ($La_2O_3$), and mixtures/ laminates thereof. In a suitable configuration in a VNAND memory architecture, the other dielectric layer (750) may serve as a tunnel layer, and may be adjacent to a, e.g. doped polysilicon, channel layer (not shown).

Figure 8:
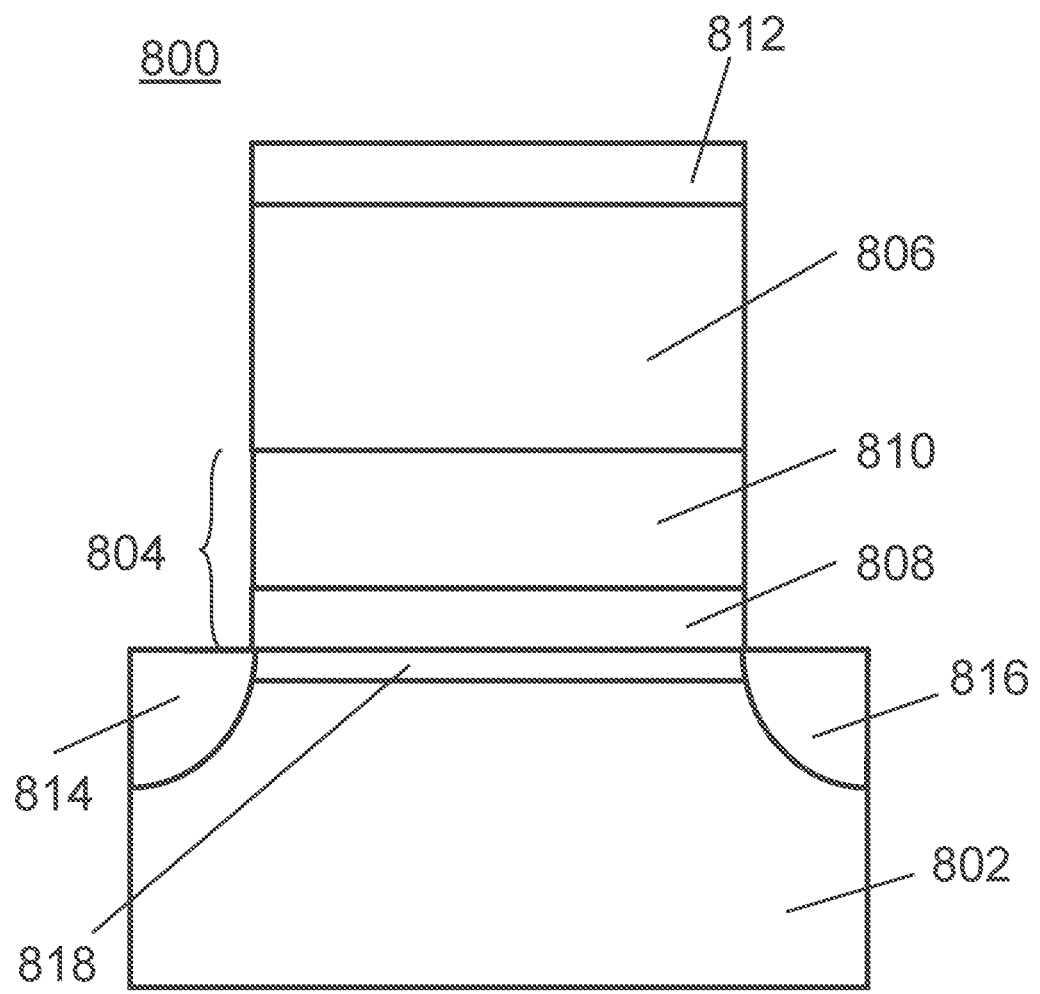
FIG. 8 illustrates another exemplary structure 800 in accordance with examples of the disclosure.

FIG. 8 illustrates another exemplary structure (800) in accordance with examples of the disclosure. This device or structure (800) includes a substrate (802), a dielectric material (804), and a layer (806) containing a material that is formed by means of a method as described herein. In the illustrated example, the structure (800) also includes an additional conducting layer (812).

In the illustrated example, the substrate (802) includes a source region (814), a drain region (816), and a channel region (818). Although illustrated as a horizontal structure, structures and devices in accordance with examples of the disclosure can include vertical and/or three-dimensional structures and devices, such as FinFET devices, and Gate-all-around MOSFETs.

In an exemplary embodiment, reference is made to a process for forming TiAlCN. The process comprises the use of a titanium precursor and a nitrogen reactant in the transition metal sub cycle, and the use of an aluminum precursor and a carbon reactant in the group 13 element sub cycle. In particular, trimethylaluminum is used as an aluminum precursor, $TiCl_4$ is used as a titanium precursor, $NH_3$ is used as a nitrogen reactant, and 1,4-cyclohexadiene is used as a carbon reactant. Accordingly, a material comprising both AlC and TiN can be formed, which can be useful to obtain a gate electrode having a mid-gap work function for a metal oxide semiconductor field effect transistor (MOSFET). An exemplary TiAlCN material can be formed, for example, using three super cycles, in which a single super cycle comprises executing 50 subsequent TiN sub cycles and 20 subsequent AlC sub cycles. A TiN sub cycle comprises exposing the substrate to the titanium precursor and to a nitrogen reactant. An AlC sub cycle comprises exposing the substrate to an aluminum precursor and to a carbon reactant. A layer formed using trimethylaluminum, $TiCl_4$, 1,4-cyclohexadiene, and $NH_3$ can have a sheet resistance of 687 Ohms per square, and a non-uniformity of 2.4% on a 300 mm wafer, as measured by 4 point probe measurements.

In an exemplary embodiment, reference is made to a process for forming TiAlN. The process comprises the use of a titanium precursor and a nitrogen reactant in the transition metal sub cycle, and the use of an aluminum precursor in the group 13 element sub cycle. In particular, trimethylaluminum is used as an aluminum precursor, $TiCl_4$ is used as a titanium precursor, and $NH_3$ is used as a nitrogen reactant. Accordingly, a material comprising Ti, Al, and C can be formed, which can be useful to obtain a gate electrode for a metal oxide semiconductor field effect transistor (MOSFET). An exemplary TiAlN material can be formed, for example, using three super cycles, in which a single super cycle comprises executing 50 subsequent TiN sub cycles and 20 subsequent Al sub cycles. A TiN sub cycle comprises exposing the substrate to the titanium precursor and to a nitrogen reactant. An Al sub cycle comprises exposing the substrate to an aluminum precursor. A layer formed using trimethylaluminum, $TiCl_4$, and $NH_3$ can have a sheet resistance of 610 Ohms per square, and a non-uniformity of 1.9% on a 300 mm wafer, as measured by 4 point probe measurements.

In a further exemplary embodiment, reference is made to another process for forming TiAlCN. The process comprises the use of a titanium precursor and a nitrogen reactant in the transition metal sub cycle, and the use of an aluminum precursor and a carbon reactant in the group 13 element sub cycle. In particular, trimethylaluminum is used as an aluminum precursor, $TiCl_4$ is used as a titanium precursor, $NH_3$ is used as a nitrogen reactant, and 1,4-cyclohexadiene is used as a carbon reactant. A process comprising only one super cycle is employed: first, ca. 5 nm of TiN are deposited, and then 200 group 13 element sub cycles are used.

Accordingly, a material comprising both AlC and TiN can be formed, which can be useful to obtain a gate electrode having a mid-gap work function for a metal oxide semiconductor field effect transistor (MOSFET). An exemplary TiAlCN material can be formed, for example, using three super cycles, in which a single super cycle comprises executing 50 subsequent TiN sub cycles and 20 subsequent AlC sub cycles. A TiN sub cycle comprises exposing the substrate to the titanium precursor and to a nitrogen reactant. An AlC sub cycle comprises exposing the substrate to an aluminum precursor and to a carbon reactant. A layer formed using trimethylaluminum, $TiCl_4$, 1,4-cyclohexadiene, and $NH_3$ can have a sheet resistance of 687 Ohms per square, and a non-uniformity of 2.4% on a 300 mm wafer, as measured by 4 point probe measurements. During the group 13 element sub cycles trimethylaluminum pulses last 80 ms, and 1,4-cyclohexadiene pulses last 75 ms. The trimethylaluminum pulses and the 1,4-cyclohexadiene pulses are separated by purges that last 1000 ms. Subsequent group 13 element sub cycles are separated by inter group 13 element sub cycle purges that last 6000 ms. Thus, a titanium, aluminum, carbon, and nitrogen containing layer can be formed. This titanium, aluminum, carbon, and nitrogen containing layer can be merged into a single homogeneous TiAlCN layer upon annealing, for example during the deposition itself, or during a further process step. The as-deposited titanium, aluminum, carbon, and nitrogen containing layer has a sheet resistance of 433 Ohms per square and a non-uniformity of 2.4%, as measured by 4 point probe measurements on a 300 mm wafer, for a deposition temperature of 300° C.; a sheet resistance of 415 Ohms per square and a non-uniformity of 4.8%, as measured by 4 point probe measurements on a 300 mm wafer, for a deposition temperature of 350° C.; a sheet resistance of 397 Ohms per square and a non-uniformity of 2.5%, as measured by 4 point probe measurements on a 300 mm wafer, for a deposition temperature of 400° C.; and a sheet resistance of 368 Ohms per square and a non-uniformity of 1.2%, as measured by 4 point probe measurements on a 300 mm wafer, for a deposition temperature of 450° C. All bilayers have a sheet resistance that is lower than a 5 nm TiN reference layer that has a sheet resistance of 485 Ohms per square and a non-uniformity of 1.7%, as measured by 4 point probe measurements on a 300 mm wafer. The sheet resistance was found to be stable in air for at least 24 hours, for all samples.

Figure 9:
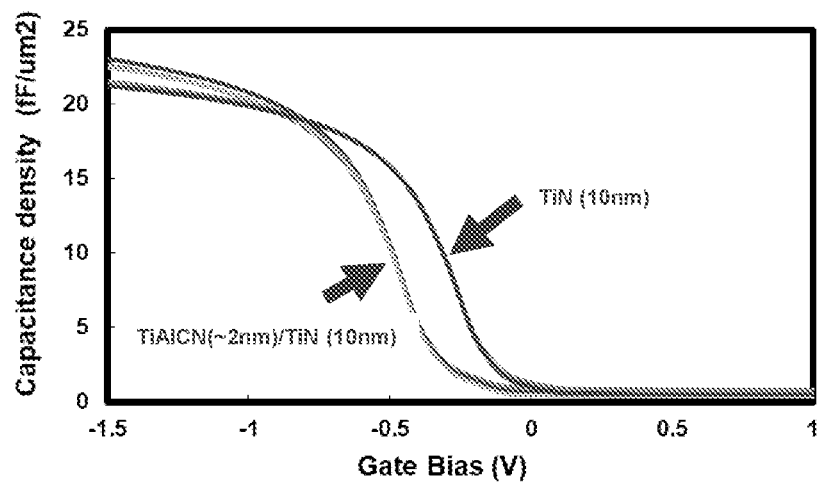
FIG. 9 shows measurement results obtained on structures comprising a material that is formed according to a method as described herein.

FIG. 9 shows capacitance-voltage (CV) measurements on a metal-oxide-semiconductor capacitor (MOSCAP) structure comprising an electrode that in turn comprises a 2 nm thick TiAlCN layer adjacent to the oxide, and covered by a TiN layer. These measurements are compared to similar measurements on a MOSCAP structure comprising a bulk TiN layer as an electrode. The CV measurements show a clear threshold voltage shift compared to the reference. The electrode comprising 2 nm TiAlCN has an effective work function of to ca. 4.6 eV. Advantageously, the equivalent oxide thickness (EOT) was found to be unchanged compared to the reference. In other words, no EOT degradation occurred, the achievement of a mid-gap work function notwithstanding.

In an exemplary embodiment, reference is made to a process for forming TiAlC, i.e. for forming a material comprising Ti, Al, and C. The process comprises the use of a titanium precursor and a nitrogen reactant in the transition metal sub cycle, and the use of an aluminum precursor and a carbon reactant in the group 13 element sub cycle. In particular, bis(tert-butyl)methylaluminum is used as an aluminum precursor, $TiCl_4$ is used as a titanium precursor, $NH_3$ is used as a nitrogen reactant, and 1,4-cyclohexadiene is used as a carbon reactant. Accordingly, a material comprising both Al, C, Ti, and N can be formed, which can be useful to obtain a gate electrode having a mid-gap work function for a metal oxide semiconductor field effect transistor (MOSFET). An exemplary TiAlC material can be formed, for example, by first exposing a substrate to a plurality of titanium precursor pulses, such as 10 titanium precursor pulses. The titanium precursor pulses can be separated by purges. In some exemplary embodiments, such titanium precursor pulses last 2 s, and they are separated by purges that last 1.5 s. Then, the substrate can be alternatingly exposed to an aluminum precursor that comprises aluminum and carbon, and to a titanium precursor. A suitable aluminum precursor includes a heteroleptic aluminum alkyl such as bis(tert-butyl)methylaluminum, and a suitable titanium precursor includes a titanium halide such as $TiCl_4$. The aluminum precursor pulses can last, for example, 6 seconds. The titanium precursor pulses can last, for example, 2 seconds. Suitably the aluminum precursor pulses and the titanium precursor pulses can be separated by a purge that can, for example, last 4 seconds. Optionally, subsequent super cycles can be separated by an inter super cycle purge that lasts, for example, 2 seconds. The TiAlC material can be deposited in a showerhead-type reaction chamber. Suitable reaction conditions are: reaction chamber pressure: 3 Torr; number of super cycles: 60; aluminum precursor and titanium precursor source temperature: room temperature, i.e. ca. 25° C.; susceptor temperature: 400° C.; showerhead temperature: 110° C. A 14.3 nm thick layer consisting of such a material can have a sheet resistance of 655 Ohms per square, with a non-uniformity of 0.9%, as deposited on a 300 mm wafer, and as measured by 4 point probe measurements. A growth rate of 0.25 nm per cycle can be obtained. X-ray photoelectron Spectroscopy (XPS) measurements indicate a uniform composition of thusly deposited films. In particular, the composition was found to be: 11.2 atomic percent aluminum, 34.5 atomic percent carbon, 14.6 atomic percent oxygen, 36.4 atomic percent titanium, and 3.3 atomic percent Cl. The origin of the oxygen signal during XPS measurements is uncertain. The oxygen could come from an underlying thermal oxide or the film could have been oxidized during ambient exposure between deposition and analysis. The XPS oxygen signal could also originate from a background $O_2$ signal as a result of sputtering. Additionally or alternatively, $O_2$ could be removed from the film during sputtering but then re-react with Al or Ti.

Figure 10:
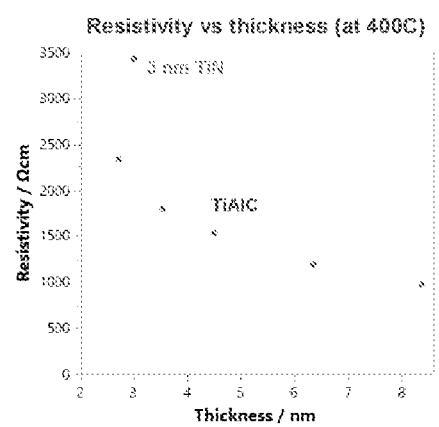
FIG. 10 shows measurement results obtained on structures comprising a material that is formed according to a method as described herein.

FIG. 10 shows the resistivity as a function of thickness of a layer that consists of such a material. The material has a lower resistivity than TiN, and shows excellent resistivity scalability, i.e. its resistivity stays comparatively low even when the layer's thickness is reduced. Advantageously, it was found that the layer's resistivity is stable for a wide range of thicknesses and deposition temperatures. Also, periodic sheet resistance measurements indicated that sheet resistance is stable for 2 to 8 nm thick films for 3 days. The TiAlC material was used for fabricating MOSCAPS having an electrode that has the following stack of layers: 1.5 nm TiN layer/TiAlC/10 nm TiN electrode. When the TiN electrode was formed after the TiAlC had been exposed to atmospheric air, the MOSCAP results indicated an effective work function of 4.42 eV for a 2 nm thick TiAlC layer. When the TiN electrode was formed in-situ, i.e. without first allowing the TiAlC to contact atmospheric air, an effective work function of 4.34 eV was obtained for a 2 nm thick TiAlC layer. Without being bound by any theory or particular mode of operation, it is believed that the TiAlC layer can provide such a low work function through incorporation of metallic aluminum. Accordingly, such a layer can be suitably employed in a gate electrode for an NMOS field effect transistor.

In another exemplary embodiment, reference is made to a process for forming a material comprising titanium, aluminum, carbon, and nitrogen, i.e. TiAlCN. The process comprises the use of a titanium precursor and a nitrogen reactant in the transition metal sub cycle, and the use of an aluminum precursor that contains carbon and aluminum in the group 13 element sub cycle. In particular, trimethylaluminum is used as an aluminum precursor, $TiCl_4$ is used as a titanium precursor, and $NH_3$ is used as a nitrogen reactant. Accordingly, a material comprising Ti, Al, C, and N can be formed, which can be useful to obtain a gate electrode having a mid-gap work function for a metal oxide semiconductor field effect transistor (MOSFET). An exemplary TiAlC material can be formed, for example, using three super cycles, in which a single super cycle comprises executing 50 subsequent TiN sub cycles and 20 subsequent aluminum precursor pulses. A TiN sub cycle comprises exposing the substrate to the titanium precursor and to a nitrogen reactant. An aluminum precursor pulse comprises exposing the substrate to trimethylaluminum. A layer formed using trimethylaluminum, $TiCl_4$, and $NH_3$ can have a sheet resistance of 610 Ohms per square, and a non-uniformity of 1.9% on a 300 mm wafer, as measured by 4 point probe measurements.

In another exemplary embodiment, a TiN layer was grown using 85 TiN sub cycles comprising alternatingly exposing the substrate to $TiCl_4$ and $NH_3$. This TiN layer was then exposed to trimethylaluminum in 400 subsequent pulses. The untreated TiN layer had a sheet resistance of 10764 Ohms per square with a non-uniformity of 6.4% on a 300 mm wafer, as measured by 4 point probe measurements. After exposure to trimethylaluminum, the layer's sheet resistance dropped to 2980 Ohms per square with a non-uniformity of 4.3% on a 300 mm wafer, as measured by 4 point probe measurements. The sheet resistance was found to be stable for at least 24 hours. An intervening air break, between TiN deposition and trimethylaluminum exposure, did not appear to have a significant influence on the final sheet resistance that was obtained. CV measurements on a MOSCAP the electrode of which comprises 2 nm of the trimethylaluminum-exposed TiN layer indicated an effective work function of the electrode of 4.7 eV. The effective work function can be easily controlled from 4.83 to 4.60 eV by changing the deposition parameters.

Figure 11:
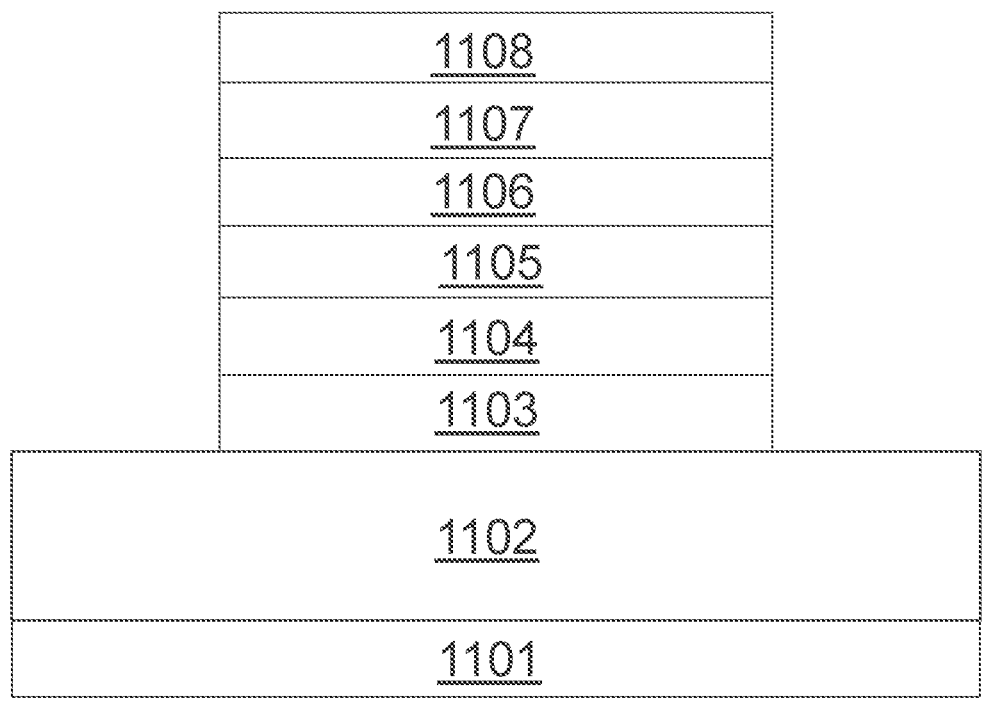
FIG. 11 illustrates another exemplary structure in accordance with examples of the disclosure.

The MOSCAP used in the CV measurements disclosed herein has a structure according to FIG. 11. In particular, the MOSCAP comprises a silicon substrate (1102) in contact with a platinum electrode (1101). Overlying the silicon substrate (1102) is a silicon oxide layer (1103). Overlying the silicon oxide layer (1103) is a hafnium oxide layer (1104). Overlying the hafnium oxide layer (1104) is a conductive bottom liner (1105). Overlying the conductive bottom liner (1105) is a layer (1106) formed by means of a method as disclosed herein. Overlying the layer (1106) formed by means of a method as disclosed herein is a conductive material (1107). Overlying the conductive material (1107) is a platinum electrode (1108).

The example embodiments of the disclosure described above do not limit the scope of the invention, since these embodiments are merely examples of the embodiments of The invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method for forming a material on a substrate, the method comprising:
   providing a substrate to a reaction chamber; and
   executing one or more super cycles, a super cycle comprising:
      one or more transition metal sub cycles; and
      a group 13 element sub cycle;
   the one or more transition metal sub cycles comprising:
      a transition metal precursor pulse that comprises exposing the substrate to a transition metal precursor; and
   the group 13 element sub cycle comprising:
   a group 13 element precursor pulse that comprises exposing the substrate to a group 13 element precursor; and
   a carbon reactant pulse that comprises exposing the substrate to a carbon reactant, wherein the carbon reactant comprises carbon, hydrogen, and at least two unsaturated carbon-carbon bonds.

2. The method according to claim 1 wherein the carbon reactant comprises a cyclohexadiene.

3. The method according to claim 1 wherein at least one super cycle comprises a plurality of transition metal sub cycles.

4. The method according to claim 1 wherein the one or more transition metal sub cycles further comprise a nitrogen reactant pulse, the nitrogen reactant pulse comprising exposing the substrate to a nitrogen reactant.

5. The method according to claim 4 wherein the nitrogen reactant comprises nitrogen and hydrogen.

6. The method according to claim 1 wherein the transition metal precursor comprises a transition metal halide.

7. The method according to claim 6 wherein the transition metal halide comprises $TiCl_4$.

8. The method according to claim 1 wherein the group 13 element precursor has a general formula of $MR^1_2R^2$, wherein M is a group 13 element, wherein $R^1$ is a first alkyl, wherein $R^2$ is a second alkyl, and wherein $R^1$ and $R^2$ are different, and comprises an aluminum alkyl.

9. The method according to claim 8 wherein $R^1$ is propyl, butyl, pentyl, or hexyl, and wherein $R^2$ is methyl or ethyl.

10. The method according to claim 8 wherein $R^1$ is tert-butyl, and wherein $R^2$ is methyl.

* * * * *